(12) United States Patent
Kao

(10) Patent No.: US 9,704,586 B1
(45) Date of Patent: Jul. 11, 2017

(54) FLASH MEMORY DEVICE HAVING PHYSICAL DESTROY MEANS

(71) Applicant: Innodisk Corporation, New Taipei (TW)

(72) Inventor: Chih-Chieh Kao, New Taipei (TW)

(73) Assignee: INNODISK CORPORATION, New Taipei (TW)

( * ) Notice: Subject to any disclaimer, the term of this patent is extended or adjusted under 35 U.S.C. 154(b) by 0 days.

(21) Appl. No.: 15/349,751

(22) Filed: Nov. 11, 2016

(30) Foreign Application Priority Data

Sep. 8, 2016 (TW) .............................. 105129097 A

(51) Int. Cl.
| | | |
|---|---|---|
| *G11C 16/04* | (2006.01) | |
| *G11C 16/22* | (2006.01) | |
| *G11C 16/30* | (2006.01) | |
| *G06F 3/06* | (2006.01) | |

(52) U.S. Cl.
CPC ............ *G11C 16/22* (2013.01); *G06F 3/0604* (2013.01); *G06F 3/0661* (2013.01); *G06F 3/0688* (2013.01); *G11C 16/30* (2013.01)

(58) Field of Classification Search
CPC ....... G11C 16/22; G11C 16/30; G06F 3/0604; G06F 3/0611; G06F 3/0688
See application file for complete search history.

(56) References Cited

U.S. PATENT DOCUMENTS

| | | | | | |
|---|---|---|---|---|---|
| 7,684,246 | B2 * | 3/2010 | Jeong | ..................... | G11C 5/145 365/185.18 |
| 7,688,667 | B2 * | 3/2010 | Cha | ......................... | G11C 5/14 327/540 |
| 7,813,184 | B2 * | 10/2010 | Kim | .................... | G11C 16/0483 365/185.11 |
| 7,817,471 | B2 * | 10/2010 | Lee | ....................... | G11C 5/145 365/185.11 |

* cited by examiner

*Primary Examiner* — Pho M Luu
(74) *Attorney, Agent, or Firm* — Chun-Ming Shih

(57) ABSTRACT

A flash memory device. The flash memory device comprises a controller, a plurality of flash memories, and a voltage control circuit. The voltage control circuit comprises a boost converter, a buck converter, and a voltage controller. The boost converter receives a system voltage to generate a first high voltage. The buck converter receives the first high voltage and provides an output voltage to the controller and the flash memories. The voltage controller detects the output voltage generated by the buck converter, and therefore generates a feedback signal. When the voltage controller receives a physical destruction control signal from a host computer, the buck converter will generate an output signal with high level according to the control of the feedback signal. Afterwards, semiconductor physical elements of the controller and the flash memories will be burned by the output signal with high level.

10 Claims, 3 Drawing Sheets

FLASH MEMORY DEVICE HAVING PHYSICAL DESTROY MEANS

This non-provisional application claims priority claim under 35 U.S.C. §119(a) on Taiwan Patent Application No. 105129097 filed Sep. 8, 2016, the entire contents of which are incorporated herein by reference.

FIELD OF THE INVENTION

The present invention relates to a flash memory device, more particularly, to a flash memory device having physical destroy means.

BACKGROUND

Flash memory device (such as SSD, SD card, CF card, usb flash drive) is often used for storing secrecy data, for example, financial data, military data. When the flash memory device must be destroyed in an abnormal emergency happened, a computer host will input an external high-voltage (such as 24V) higher than the operating voltage of the flash memory device to the flash memory device, so as to execute a physical destruction process for the flash memory device. Thus, physical elements of controller and flash memories within the flash memory device will be destroyed by the external high-voltage, in such the way that the secrecy data stored in the flash memory device can be avoided to be stolen.

The physical destruction process is executed by the use of the external high-voltage, the computer host must be provided therein with a customization motherboard having a circuit capable of generating the external high-voltage. The customization motherboard will bring users, who need the security of data, many hardware establishment cost.

For the reason, the present invention provides a novel flash memory device having physical destruction means. The flash memory device of the present invention is configured therein with a voltage control circuit capable of providing a high voltage for executing a physical destruction process. Thus, the flash memory device is able to destroy the semiconductor physical elements of the controller and the flash memories disposed therein.

SUMMARY

It is one object of the present invention to provide a flash memory device having physical destroy means. The flash memory device comprises a voltage control circuit, a controller, and a plurality of flash memories. The voltage control circuit is able to be provided with a low voltage required of normal operation of the flash memory device, or a high voltage used for destroying semiconductor physical elements of the controller and the flash memories. When the flash memory device executes a physical destruction process, the voltage control circuit will output the high voltage to the controller and the flash memories so that the semiconductor physical elements of the controller and the flash memories can be destroyed by the use of the high voltage.

To achieve the above object, the present invention provides a flash memory device, comprising: a controller; a plurality of flash memories; and a voltage control circuit, comprising: a boost converter receiving a system voltage and generating a first high voltage; a buck converter connected to the controller, the flash memories, and the boost converter, wherein the buck converter receives the first high voltage, and generates an output voltage provided to the controller and the flash memories; and a voltage controller connected to the buck converter, wherein the voltage controller detects the output voltage generated by the buck converter, and therefore generates a feedback signal; when the voltage controller receives a normal operation control signal, the buck converter will generate an output voltage with low level according to the control of the feedback signal generated by the voltage controller; when the voltage controller receives a physical destruction control signal, the buck converter will generate an output voltage with high level according to the control of the feedback signal generated by the voltage controller; wherein the output voltage with low level is a low voltage required of normal operation of the the flash memory device, and the output voltage with high level is a high voltage used for destroying semiconductor physical elements of the controller and/or the flash memories.

In one embodiment of the present invention, wherein the voltage controller comprises a voltage division circuit and a switcher, the voltage division circuit is connected to the buck converter and the switcher, and detects the output voltage of the buck converter; when the switcher receives the normal operation control signal, the switcher will be operated in a turned-off state, the buck converter will generate the output voltage with low level according to the control of the feedback signal generated by the voltage division circuit; when the switcher receives the physical destruction control signal, the switcher will be operated in a turned-on state, the buck converter will generate the output voltage with high level according to the control of the feedback signal generated by the voltage division circuit.

In one embodiment of the present invention, wherein the voltage division circuit comprises a first resistor, a second resistor, and a third resistor, one end of the first resistor, one end of the second resistor, and one end of the third resistor are connected to a first node, other end of the first resistor is connected to an output end of the buck converter, other end of the second resistor is grounded, other end of the third resistor is grounded via the switcher, a reference voltage is set on the first node, in such a way that the feedback signal is corresponding responded on the first node according to the truned-off state or the turned-on state of the switcher controlled by the normal operation control signal or the physical destruction control signal.

In one embodiment of the present invention, wherein the flash memory device is connected to a computer host, the computer host outputs the normal operation control signal or the physical destruction control signal to the voltage control circuit of the flash memory device via an input and output port.

In one embodiment of the present invention, wherein the input and output port is a general purpose input and output port.

In one embodiment of the present invention, wherein the flash memory device is connected to a computer host, the computer host comprises a switch unit, the computer host will send the normal operation control signal to the flash memory device when the switch unit is switched in a turned-off state, or the computer host will send the physical destruction control signal to the flash memory device when the switch unit is switched in a turned-on state.

In one embodiment of the present invention, wherein the flash memory device is connected to a computer host, the controller comprises a input and output port, when the computer host issues a physical destruction command to the controller via a transmission interface, the controller will generate and transmit the physical destruction control signal to the voltage controller via the input and output port.

In one embodiment of the present invention, wherein a latch circuit is disposed between the controller and the voltage controller, the latch circuit is used for holding the physical destruction control signal.

In one embodiment of the present invention, wherein the latch circuit is a flip-flop.

The present invention further provides a flash memory device, comprising: a controller; a plurality of flash memories; and a voltage control circuit, comprising: a boost converter receiving a system voltage and generating a first high voltage; a buck converter connected to the controller, the flash memories, and the boost converter, wherein the buck converter receives the first high-voltage, and generates an output voltage provided to the controller and the flash memories; and a voltage controller connected to the buck converter, wherein the voltage controller detects the output voltage generated by the buck converter, and therefore generates a feedback signal; when the voltage controller receives a physical destruction control signal, the buck converter will generate an output voltage with high level by the control of the feedback signal generated by the voltage controller; wherein the output voltage with high level is a high voltage used for destroying semiconductor physical elements of the controller and/or the flash memories.

DETAILED DESCRIPTION OF THE PREFERRED EMBODIMENTS

Figure 1:
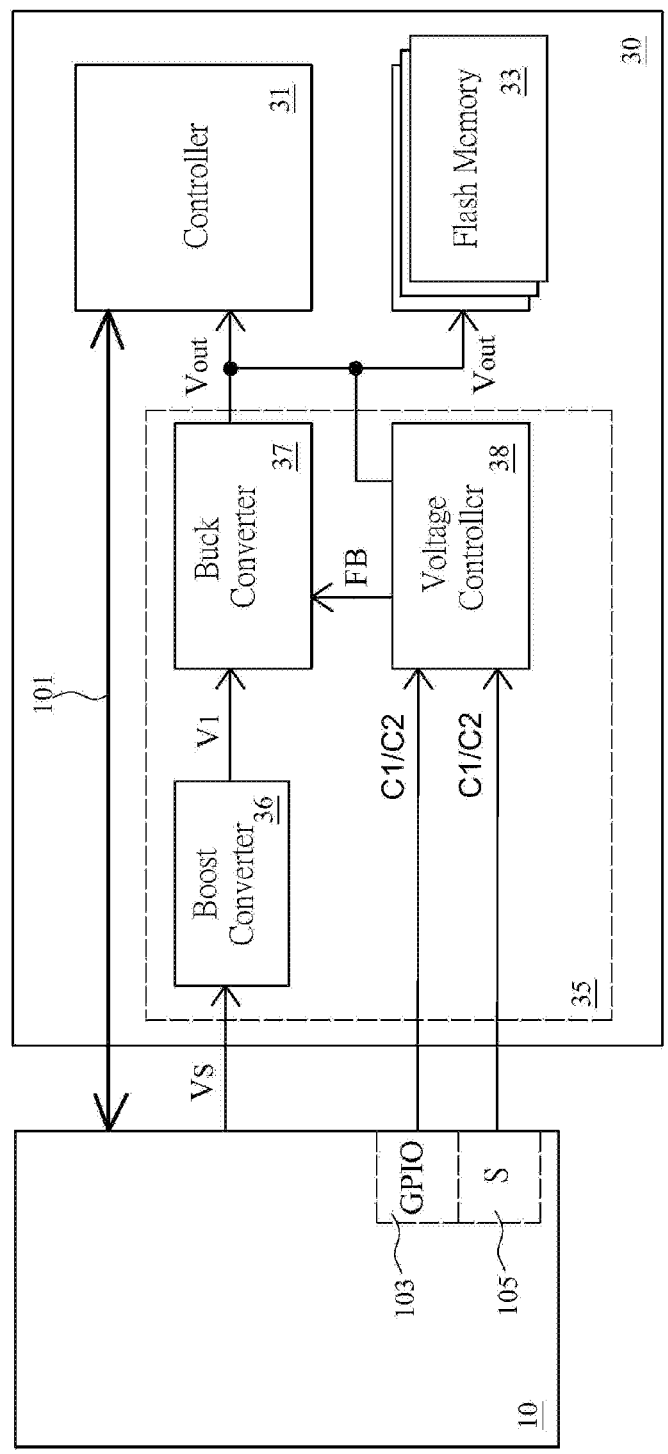
FIG. 1 is a structural diagram of a flash memory device according to one embodiment of the present invention.

Referring to FIG. 1, there is shown a structural diagram of a flash memory device according to one embodiment of the present invention. As shown in FIG. 1, the flash memory device 30 is electrically connected to a computer host 10, and executes data transmission with the computer host 10 via a transmission interface 101. The transmission interface 101 is a USB interface, PCIe interface, SATA3 interface, or an interface conforming to other data transport protocols. In the present invention, the computer host 10 is able to execute a normal operation process or a physical destruction process for the flash memory device 30.

Wherein, the flash memory device 30 comprises a controller 31, a plurality of flash memories 33, and a voltage control circuit 35. The voltage control circuit 35 comprises a boost converter 36, a buck converter 37, and a voltage controller 38. The buck converter 37 is connected to the controller 31, the flash memories 33, the boost converter 36, and the voltage controller 38. The computer host 10 can provide a system voltage Vs, for example, 3V or 5V, to the flash memory device 30. When the boost converter 36 receives the system voltage Vs, it will boost the system voltage Vs to generate a first high voltage $V_1$, for example, 24V. When the buck converter 37 receives the first high voltage $V_1$, an output voltage Vout will be generated on an output end of the buck converter 37. In the present invention, the buck converter 37 is an adjustable buck converter that can be provided with a variety of output voltages Vout. The voltage controller 38 detects the output voltage Vout of the buck converter 37, generates a feedback signal $F_B$, and adjusts the output voltage Vout of the buck converter 37 by the feedback signal $F_B$. In one embodiment of the present invention, the feedback signal $F_B$ is a current signal.

In one embodiment of the present invention, the computer host 10 comprises an input and output port 103. The input and output port 103 is a general purpose input and output (GPIO) port. The input and output port 103 is connected to the voltage controller 38 of the flash memory device 30. The computer host 10 can transmit a normal operation control signal C1 or a physical destruction control signal C2 to the voltage control circuit 38. The normal operation control signal C1 is a logic signal with low level (Lo), and the physical destruction control signal C2 is a logic signal with high level (Hi). When the voltage controller 38 receives the normal operation control signal C1, the buck converter 37 will generate an output voltage $V_{OUT}$ with low level (such as 1.8V or 3.3V) according to the control of the feedback signal FB. The output voltage $V_{OUT}$ with low level is a low voltage required of normal operation of the flash memory device 30. On the contrary, when the voltage controller 38 receives the physical destruction control signal C2, the buck converter 37 will generate an output voltage $V_{OUT}$ with high level (such as 24V or other high voltage values) according to the control of the feedback signal FB. The output voltage $V_{OUT}$ with high level is a high voltage used for destroying the semiconductor physical elements of the controller 31 and the flash memories 33. In the present embodiment, the control signal C1 or C2 is generated through the operation of an APP program, an operation interface, or an external electrical device provided with a remote control interface.

In another embodiment of the present invention, the computer host 10 further comprises a switch unit 105. The switch unit 105 is connected to the voltage controller 38 of the flash memory device 30. When the switch unit 105 is switched to a turned-off state, the computer host 10 will generate the normal operation control signal C1, and transmit the normal operation control signal C1 to the voltage controller 38. On the contrary, when the switch unit 105 is switched to a turned-on state, the computer host 10 will generate the physical destruction control signal C2, and transmit the physical destruction control signal C2 to the voltage controller 38.

Figure 2:
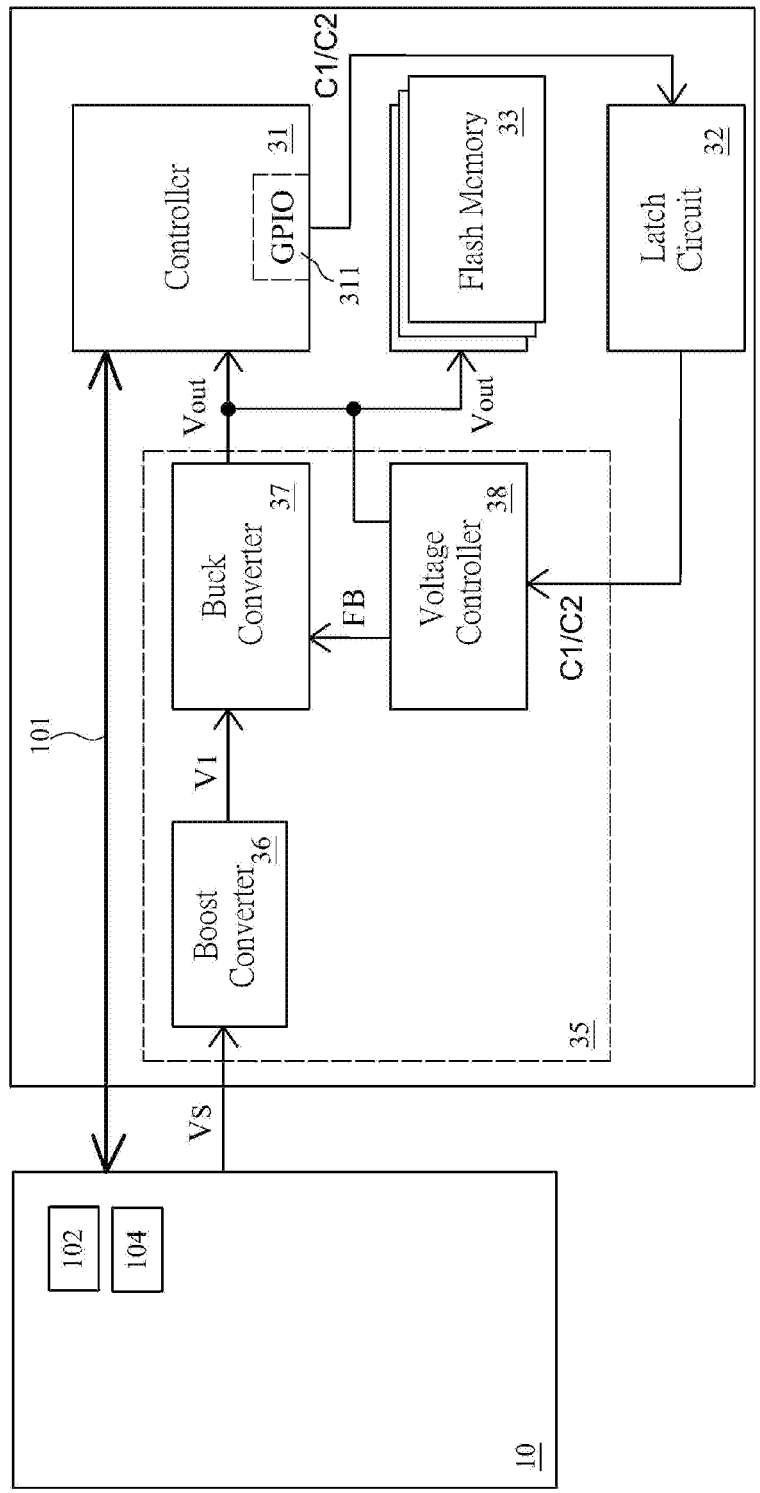
FIG. 2 is a structural diagram of the flash memory device according to another embodiment of the present invention.

In another embodiment of the present invention, as shown in FIG. 2, the controller 31 of the flash memory device 30 comprises an input and output port 311, for example, GPIO. The input and output port 311 is connected to the voltage controller 38. When the computer host 10 desires to execute a normal operation process for the flash memory device 30, it will transmit a normal operation command 102 to the controller 31 via the transmission interface 101. After the controller 31 receives the normal operation command 102, it will generate the normal operation control signal C1, and then transmit the normal operation control signal C1 to the voltage controller 38 via the input and output port 311. The voltage controller 38 will control the buck converter 37 by the feedback signal $F_B$ according to the indication of the normal operation of the control signal C1 so that the buck converter 37 can generate an output voltage Vout with low level. Otherwise, when the computer host 10 desires to execute a physical destruction process for the flash memory device 30, it will transmit a physical destruction command 104 to the controller 31 via the transmission interface 101. After the controller 31 receives the physical destruction command 104, it will generate the physical destruction control signal C2, and then transmit the physical destruction control signal C2 to the voltage controller 38 via the input and output port 311. The voltage controller 38 will control the buck converter 37 by the feedback signal $F_B$ according to the indication of the physical destruction control signal C2 so that the buck converter 37 can generate an output voltage Vout with high level.

Continually, when the computer host 10 transmits the physical destruction command 104 to the flash memory device 30, the controller 31 may be immediately destroyed, and therefore can not continuously provide the physical destruction control signal C2 to the voltage controller 38, resulting in the voltage level of the output signal Vout unable to be held in the high state so that parts of the physical elements of the flash memory 33 has not destroyed yet. Accordingly, the flash memory device 30 of FIG. 2 further comprises a latch circuit 32 disposed between the controller 31 and the voltage controller 38. The latch circuit 32 is used for holding the control signal C2 transmitted from the input and output port 311. Thus, the latch circuit 32 can continue to transmit the physical destruction control signal C2 to the voltage controller 38 when the controller 38 has been destroyed, so that all of semiconductor physical elements of the flash memories 33 can be destroyed by this output voltage $V_{OUT}$ with high level. In the present embodiment, the latch circuit 32 is a flip-flop, for example, D-type flip-flop, SR flip-flop, JK flip-flop.

Figure 3:
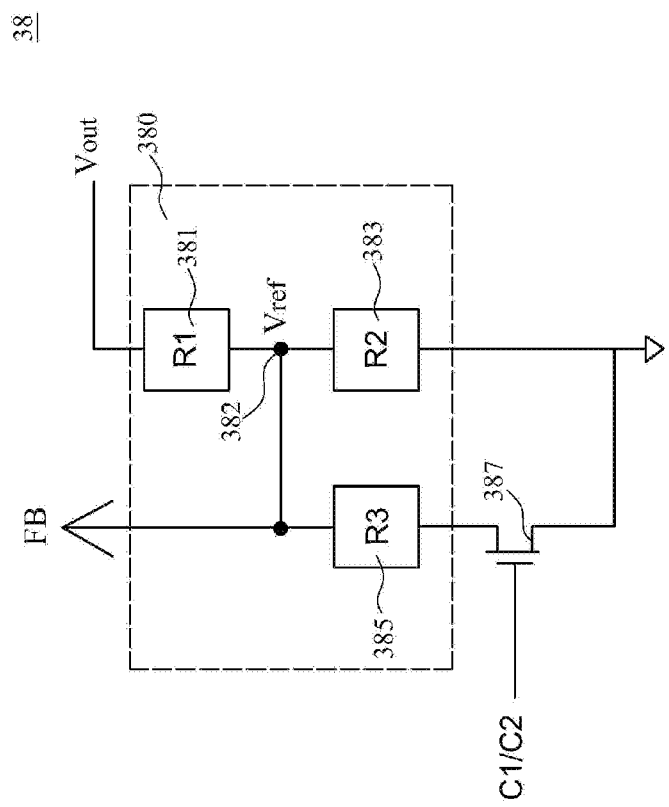
FIG. 3 is a detail structural diagram of a voltage controller of the present invention.

Referring to FIG. 3, there is shown a detail structural diagram of a voltage controller of the present invention. As shown in FIG. 3, the voltage controller 38 comprises a voltage division circuit 380 and a switcher 387. The voltage division circuit 380 is consisted of a plurality of resistors. The voltage division circuit 380 is connected to the buck converter 37 and the switcher 387, and detects the output voltage $V_{OUT}$ from the buck converter 37. Voltage division value of the voltage division circuit 380 will be changed in accordance with the turning on or turning off of the switcher 387 so as to generate the feedback signal $F_B$.

The switcher 387 is operated in a turned off state when the switcher 387 receives the normal operation control signal C1, the buck converter 37 will generate the output voltage $V_{OUT}$ with low level according to the control of the feedback signal $F_B$ generated by the voltage division circuit 380. The switcher 387 is operated in a turned on state when the switcher 387 receives the physical destruction control signal C2, the buck converter 37 will generate the output voltage $V_{OUT}$ with high level according to the control of the feedback signal $F_B$ generated by the voltage division circuit 380.

Further, the voltage division circuit 380 comprises a first resistor (R1) 381, a second resistor (R2) 383, and a third resistor (R3) 385. The first resistor (R1) 381, the second resistor (R2) 383, or the third resistor (R3) 385 is a fixed resistor or a variable resistor, respectively. One end of the first resistor (R3) 381, one end of the second resistor (R2) 383, and one end of the third resistor (R3) 385 are connected to a first node 382. Other end of the first resistor (R1) 381 is connected to an output end of the buck converter 37, other end of the second resistor (R2) 383 is directly grounded, and other end of the third resistor (R3) 385 is grounded via the switcher 387. A reference voltage Vref is set on the first node 382. The reference voltage Vref is a constant value, for example, 0.6 V. The corresponding feedback signal $F_B$ is responded on the first node 382 according to the turning on or the turning off of the switcher 387 controlled by the control signal C1 or C2.

The voltage dividing circuit 380 of the present embodiment establishes a first formula (1) and a second formula (2) related to the output voltage $V_{OUT}$. The flash memory device 30 operates in the normal operation process when the switcher 387 is turned off, the output voltage $V_{OUT}$ will be decided by the first formula (1).

$$Vout = Vref\left(1 + \frac{R1}{R2}\right) \qquad (1)$$

The flash memory device 30 operates in the physical destruction process when the switcher 387 is turned on, the output voltage $V_{OUT}$ will be decided by the first formula (2).

$$Vout = Vref\left(1 + \frac{R1 \times (R2 + R3)}{R2 \times R3}\right) \qquad (2)$$

The structure of the voltage divider circuit 380 of the above disclosure is only one embodiment of the present invention. In the practical application of the present invention, the number of resistors, the resistance values, and the serial and parallel connection among the resistors in the voltage divider circuit 380 is able to be designed and configuration according to the values of output voltage $V_{OUT}$ to be obtained.

In summary, the flash memory device 30 of the present invention is configured therein with a voltage control circuit 35 capable of providing a low voltage required of normal operation of the flash memory device 30, or high voltage used for destroying semiconductor physical elements of the controller 31 and the flash memories 33.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

The invention claimed is:
1. A flash memory device, comprising:
 a controller;
 a plurality of flash memories; and
 a voltage control circuit, comprising:
  a boost converter receiving a system voltage and generating a first high voltage;
  a buck converter connected to the controller, the flash memories, and the boost converter, wherein the buck converter receives the first high voltage, and generates an output voltage provided to the controller and the flash memories; and
  a voltage controller connected to the buck converter, wherein the voltage controller detects the output voltage generated by the buck converter, and therefore generates a feedback signal; when the voltage controller receives a normal operation control signal, the buck converter will generate an output voltage with low level according to the control of the feedback signal generated by the voltage controller; when the voltage controller receives a physical destruction control signal, the buck converter will generate an output voltage with high level according to the control of the feedback signal generated by the voltage controller; wherein the output voltage with low level is a low voltage required of normal operation of the the flash memory device, and the output voltage with high level is a high voltage used for destroying semiconductor physical elements of the controller and/or the flash memories.

2. The flash memory device according to claim 1, wherein the voltage controller comprises a voltage division circuit and a switcher, the voltage division circuit is connected to the buck converter and the switcher, and detects the output voltage of the buck converter; when the switcher receives the normal operation control signal, the switcher will be operated in a turned-off state, the buck converter will generate the output voltage with low level according to the control of the feedback signal generated by the voltage division circuit; when the switcher receives the physical destruction control signal, the switcher will be operated in a turned-on state, the buck converter will generate the output voltage with high level according to the control of the feedback signal generated by the voltage division circuit.

3. The flash memory device according to claim 2, wherein the voltage division circuit comprises a first resistor, a second resistor, and a third resistor, one end of the first resistor, one end of the second resistor, and one end of the third resistor are connected to a first node, other end of the first resistor is connected to an output end of the buck converter, other end of the second resistor is grounded, other end of the third resistor is grounded via the switcher, a reference voltage is set on the first node, in such a way that the feedback signal is corresponding responded on the first node according to the truned-off state or the turned-on state of the switcher controlled by the normal operation control signal or the physical destruction control signal.

4. The flash memory device according to claim 1, wherein the flash memory device is connected to a computer host, the computer host outputs the normal operation control signal or the physical destruction control signal to the voltage control circuit of the flash memory device via an input and output port.

5. The flash memory device according to claim 4, wherein the input and output port is a general purpose input and output port.

6. The flash memory device according to claim 1, wherein the flash memory device is connected to a computer host, the computer host comprises a switch unit, the computer host will send the normal operation control signal to the flash memory device when the switch unit is switched in a turned-off state, or the computer host will send the physical destruction control signal to the flash memory device when the switch unit is switched in a turned-on state.

7. The flash memory device according to claim 1, wherein the flash memory device is connected to a computer host, the controller comprises a input and output port, when the computer host issues a physical destruction command to the controller via a transmission interface, the controller will generate and transmit the physical destruction control signal to the voltage controller via the input and output port.

8. The flash memory device according to claim 7, wherein a latch circuit is disposed between the controller and the voltage controller, the latch circuit is used for holding the physical destruction control signal.

9. The flash memory device according to claim 8, wherein the latch circuit is a flip-flop.

10. A flash memory device, comprising:
a controller;
a plurality of flash memories; and
a voltage control circuit, comprising:
a boost converter receiving a system voltage and generating a first high voltage;
a buck converter connected to the controller, the flash memories, and the boost converter, wherein the buck converter receives the first high-voltage, and generates an output voltage provided to the controller and the flash memories; and
a voltage controller connected to the buck converter, wherein the voltage controller detects the output voltage generated by the buck converter, and therefore generates a feedback signal; when the voltage controller receives a physical destruction control signal, the buck converter will generate an output voltage with high level by the control of the feedback signal generated by the voltage controller; wherein the output voltage with high level is a high voltage used for destroying semiconductor physical elements of the controller and/or the flash memories.

* * * * *